United States Patent
Mackey

(10) Patent No.: US 10,477,685 B2
(45) Date of Patent: Nov. 12, 2019

(54) LIGHT-EMITTING DIODE CIRCUIT BOARD

(71) Applicant: Hubbell Incorporated, Shelton, CT (US)

(72) Inventor: Anthony M. Mackey, Elgin, IL (US)

(73) Assignee: Hubbell Incorporated, Shelton, CT (US)

( * ) Notice: Subject to any disclaimer, the term of this patent is extended or adjusted under 35 U.S.C. 154(b) by 223 days.

(21) Appl. No.: 15/130,364

(22) Filed: Apr. 15, 2016

(65) Prior Publication Data

US 2016/0309591 A1 Oct. 20, 2016

Related U.S. Application Data

(60) Provisional application No. 62/149,800, filed on Apr. 20, 2015.

(51) Int. Cl.
| | |
|---|---|
| *H05K 1/18* | (2006.01) |
| *H05K 3/32* | (2006.01) |
| *H05K 3/36* | (2006.01) |
| *H05K 1/14* | (2006.01) |
| *F21K 9/90* | (2016.01) |
| *F21V 23/06* | (2006.01) |
| *F21Y 105/10* | (2016.01) |
| *F21Y 115/10* | (2016.01) |

(52) U.S. Cl.
CPC ............ *H05K 1/18* (2013.01); *H05K 1/142* (2013.01); *H05K 3/32* (2013.01); *H05K 3/368* (2013.01); *F21K 9/90* (2013.01); *F21V 23/06* (2013.01); *F21Y 2105/10* (2016.08); *F21Y 2115/10* (2016.08); *H05K 2201/10106* (2013.01)

(58) Field of Classification Search
CPC ............ H05K 1/18; H05K 1/142; H05K 3/32; H05K 3/368
See application file for complete search history.

(56) References Cited

U.S. PATENT DOCUMENTS

| | | | |
|---|---|---|---|
| 2012/0073864 A1* | 3/2012 | Stefanoff | ............... H05K 1/142 174/252 |
| 2014/0160754 A1* | 6/2014 | Lee | ..................... H01L 25/0753 362/237 |

\* cited by examiner

*Primary Examiner* — Anh T Mai
*Assistant Examiner* — Nathaniel J Lee
(74) *Attorney, Agent, or Firm* — Michael Best & Friedrich, LLP

(57) ABSTRACT

A method of manufacturing a printed circuit board with a plurality of light-emitting diodes (LEDs). The method including providing a printed circuit board having a center portion, a first side portion extending outwardly from the center portion in a first direction, and a second side portion extending outwardly from the center portion in a second direction opposite the first direction; and electrically populating LEDs along the center portion, the first side portion, and the second side portion.

10 Claims, 3 Drawing Sheets

LIGHT-EMITTING DIODE CIRCUIT BOARD

RELATED APPLICATIONS

The present application claims priority to U.S. Provisional Application No. 62/149,800, filed Apr. 20, 2015, the entire contents of which are hereby incorporated.

BACKGROUND

The present application relates generally to light-emitting diode (LED) circuit boards.

SUMMARY

FIG. 1 illustrates a conventional PCB assembly 100 including a first PCB subassembly 105 and a second PCB subassembly 110. In the illustrated embodiment, PCB subassemblies 105, 110 are substantially square shaped having sides that are a distance B. In some embodiments, distance B is within a range of approximately 10 inches to approximately 11 inches (e.g., approximately 10.4 inches, approximately 10.5 inches, etc.). Additionally, as illustrated, in some embodiments when the PCB subassemblies 105, 110 are coupled together the conventional PCB assembly 100 has a height of distance B and a length of distance A. In such an embodiment, distance A may be within a range of approximately 20 inches to approximately 23 inches (e.g., approximately 22 inches, approximately 22.05 inches, etc.).

The PCB subassemblies 105, 110 each include a plurality of LEDs 115. The plurality of LEDs 115 are spaced equally around the PCB substrates of the PCB subassemblies 105, 110. In the illustrated embodiment, the plurality of LEDs 115 are spaced apart from each other by a distance C and/or a distance D. In some embodiments, distances C and D are within a range of approximately 1.5 inches to approximately 2.0 inches (e.g., approximately 1.73 inches, approximately 1.75 inches, etc.). A result of the plurality of LEDs 115 being spaced apart much unused PCB substrate is allocated to a single PCB assembly. Such a configuration is wasteful and expensive.

It is desired to have a low density of LEDs over a large area, while maintaining relatively low costs. Interlacing parts of a PCB assembly with a neighboring PCB assembly allows a plurality of PCB assemblies to fit into a single PCB panel.

Thus, in one embodiment, the invention provides a method of manufacturing a printed circuit board with a plurality of light-emitting diodes (LEDs). The method including providing a printed circuit board having a center portion, a first side portion extending outwardly from the center portion in a first direction, and a second side portion extending outwardly from the center portion in a second direction opposite the first direction; and electrically populating LEDs along the center portion, the first side portion, and the second side portion.

In another embodiment the invention provides a method of manufacturing a printed circuit board with a plurality of light-emitting diodes (LEDs). The method including providing a first printed circuit board having a first center portion, a first side portion extending outwardly from the center portion in a first direction, and a second side portion extending outwardly from the center portion in a second direction opposite the first direction. The method further including providing a second printed circuit board having a second center portion, a third side portion extending outwardly from the center portion in the first direction, and a fourth side portion extending outwardly from the center portion in the second direction. Wherein the first printed circuit board and the second printed circuit board are configured to be coupled together.

In another embodiment, the invention provides a printed circuit board including a center portion and a first side portion extending outwardly from the center portion in a first direction. The printed circuit board further includes a second side portion extending outwardly from the center portion in a second direction, the second direction opposite the first direction and a plurality of light-emitting diodes (LEDs) populated along the center portion, the first side portion, and the second side portion.

Other aspects of the invention will become apparent by consideration of the detailed description and accompanying drawings.

DETAILED DESCRIPTION

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways.

Figure 1:
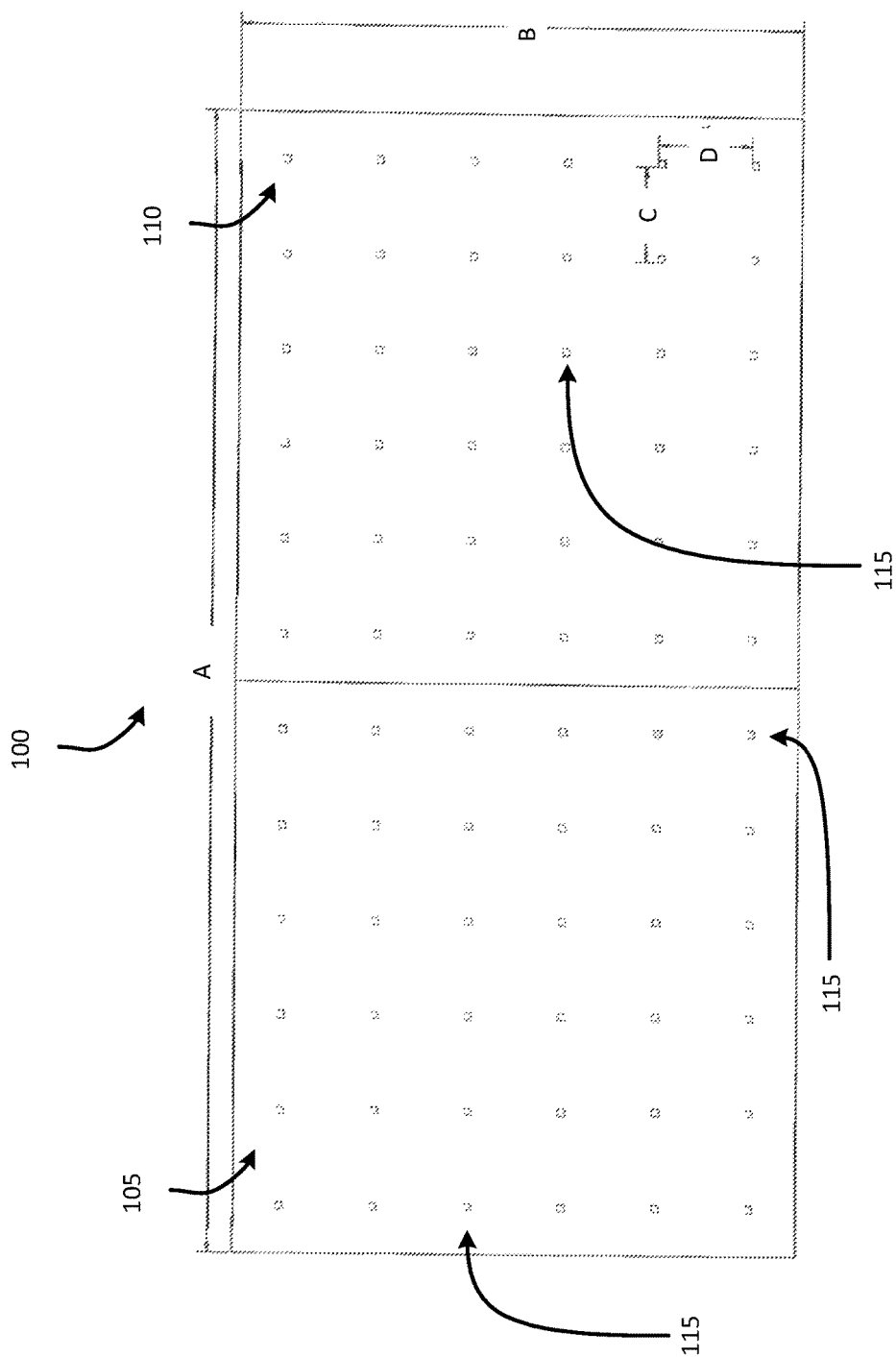
FIG. 1 illustrates a conventional printed circuit board.
Figure 2:
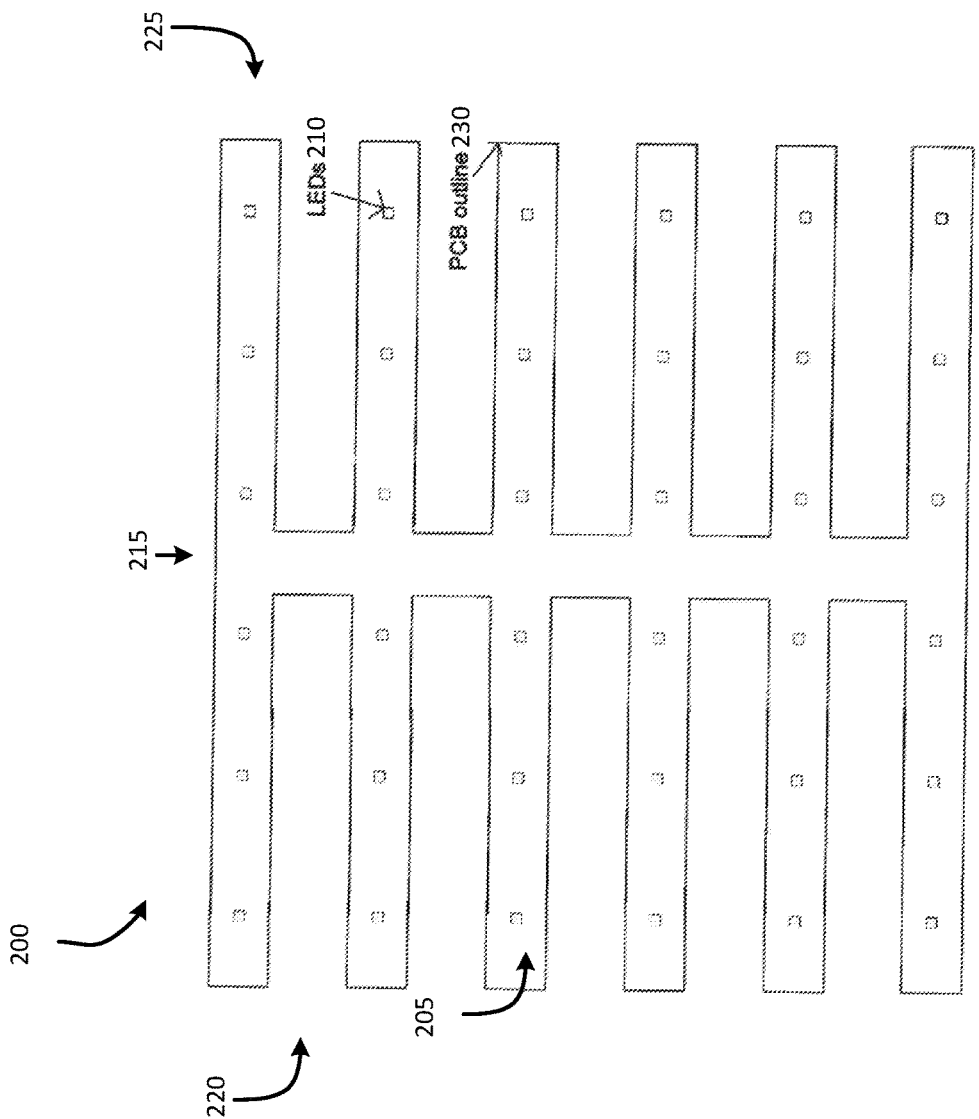
FIG. 2 illustrates a printed circuit board in accordance with an exemplary embodiment of the present application.

FIG. 2 is a block diagram of a printed circuit board (PCB) subassembly 200 in accordance with an exemplary embodiment of the present application. The PCB subassembly 200 includes a PCB substrate 205 and a plurality of light-emitting diodes (LEDs) 210. The PCB substrate 205 is non-conductive and used to support the plurality of LEDs 210. The plurality of LEDs 210 are semiconductor light sources that emit light when a suitable voltage is applied. The PCB substrate 205 has a "tree" shape including a center portion 215, a first side portion 220, and a second side portion 225. The two side portions 220, 225 extend outwardly from the center portion 215. In some embodiments, the two side portions 220, 225 extend outwardly from the center portion 215 in opposite directions.

Figure 3:
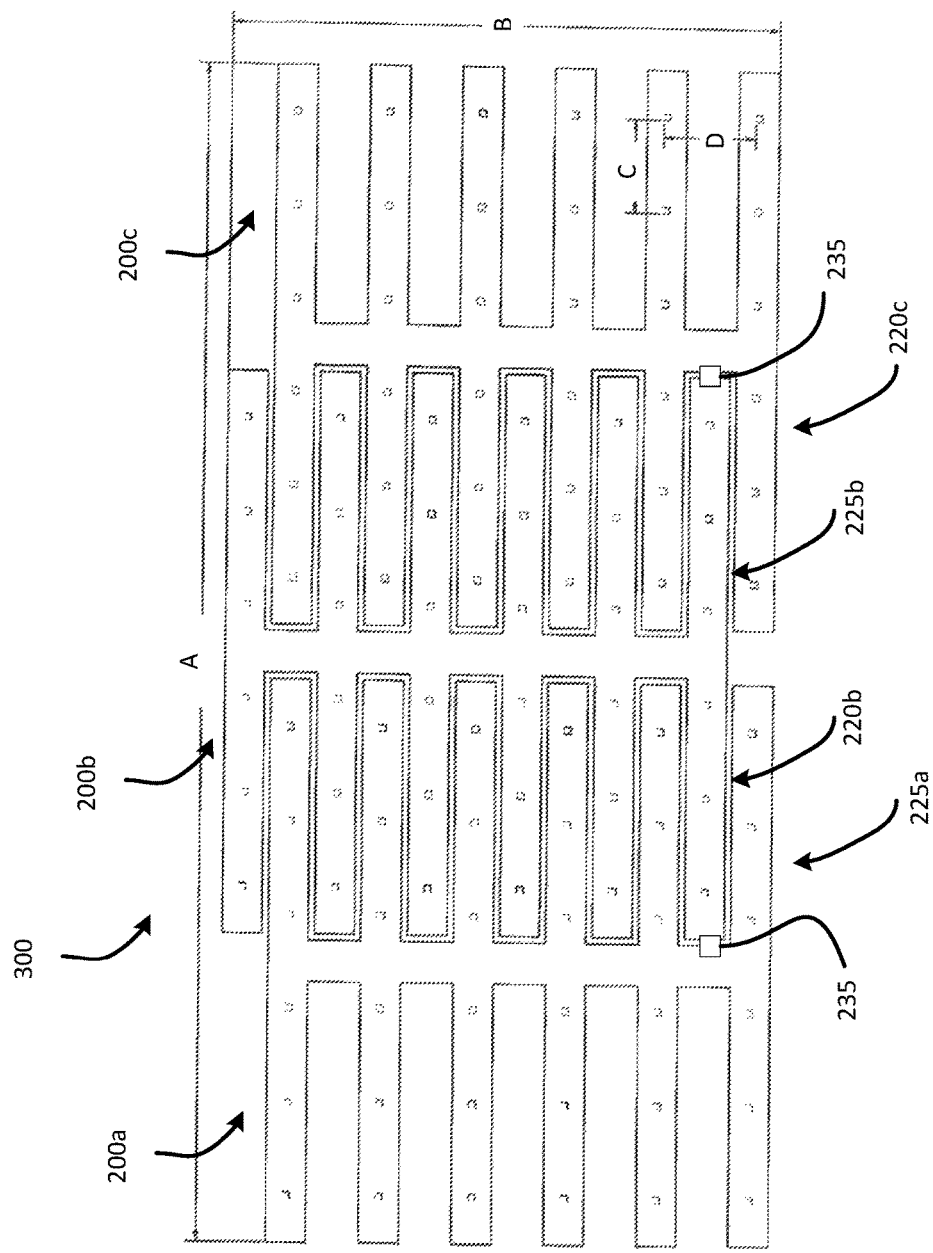
FIG. 3 illustrates a plurality of printed circuit boards of FIG. 2 interlaced with each other.

FIG. 3 is a block diagram of a plurality of PCB subassemblies 200a, 200b, 200c interlaced with each other to form a PCB assembly 300. As illustrated, the right side portion 225a of PCB subassembly 200a is interlaced with the left side portion 220b of PCB subassembly 200b, while the left side portion 220c of PCB subassembly 200c is interlaced with the right side portion 225b of PCB subassembly 200b. In some embodiments, PCB assemblies 200a, 200b, and 200c may be coupled together via one or more connectors 235. Although illustrated as only having two connectors 235, it is contemplated that in other embodiments the PCB assemblies 200a, 200b, and 200c may be coupled together using three or more connectors 235. In some embodiments, the plurality of connectors 235 are located along the PCB outline 230 (illustrated in FIG. 2) of each PCB subassembly 200a, 200b, and 200c. In some embodiments the connectors couple the PCB substrates 205 together and electrically connect the plurality of LEDs 210 from each PCB subassembly 200a, 200b, and 200c. In other embodiments, the PCB subassemblies 200a, 200b, and 200c include a first set of connectors for coupling the PCB substrates 205 and a separate second set of connectors for electrically connecting the plurality of LEDs 210.

The interlacing of PCB subassemblies 200a, 200b, and 200c provide a greater number of LEDs 205 in substantially the same area as PCB assembly 100. Thus, the interlacing of PCB subassemblies 200a, 200b, and 200c optimizes the PCB substrate thus leading to lower costs. The PCB subassemblies 200a, 200b, and 200 c may be broken, removed, cut, or generally separated from a larger PCB substrate.

In the illustrated embodiment, the PCB assembly 300 has a length of distance A and a height of distance B. In some embodiments, distance A and distance B are substantially similar to distances A and B discussed above with respect to PCB assembly 100. Thus, in such an embodiment, PCB assembly 300 may have substantially similar dimensions as PCB assembly 100 while using a significantly less amount of PCB substrate and including a significantly more amount of LEDs.

Thus, in accordance with an exemplary embodiment, the present application provides, among other things, a method of manufacturing a printed circuit board, and more specifically, a method of manufacturing a printed circuit board for light-emitting diodes. Various features and advantages of the invention are set forth in the following claims.

What is claimed is:

1. A method of manufacturing a printed circuit board with a plurality of light-emitting diodes (LEDs), the method comprising:
    providing a first printed circuit board having a first center portion, the first center portion having a first length, a first side portion extending outwardly from the first center portion in a first direction, and a second side portion extending outwardly from the first center portion in a second direction opposite the first direction, the first and second side portions each having a second length;
    electrically populating a first plurality of LEDs along the first side portion, and a second plurality of LEDs along the second side portion, such that the first plurality of LEDs are spaced a first distance apart and the second plurality of LEDs are spaced the first distance apart;
    providing a second printed circuit board having a second center portion, the second center portion having the first length, a third side portion extending outwardly from the second center portion in the first direction, and a fourth side portion extending outwardly from the second center portion in the second direction, the third and fourth side portions each having the second length;
    electrically populating a third plurality of LEDs along the the third side portion, and a fourth plurality of LEDs along the fourth side portion, such that the third plurality of LEDs are spaced the first distance apart and the fourth plurality of LEDs are spaced the first distance apart;
    wherein the first printed circuit board and the second printed circuit board are configured to be coupled together, such that the first plurality of LEDs and the fourth plurality of LEDs are spaced a second distance apart, the second distance less than the first distance.

2. The method of claim 1, wherein the first printed circuit board and the second printed circuit board are coupled together by interlacing the side portions of the first circuit board and the second printed circuit board.

3. The method of claim 1, wherein the first printed circuit board and the second printed circuit board are coupled together using a connector.

4. The method of claim 3, wherein the connector is configured to electrically connect at least one of the first plurality of LEDs of the first printed circuit board to at least one of the second plurality of LEDs of the second printed circuit board.

5. The method of claim 1, wherein the first printed circuit board has a height within a range of approximately ten inches to approximately eleven inches.

6. The method of claim 1, wherein the first printed circuit board and the second printed circuit board have a substantial tree shape.

7. A printed circuit board system comprising:
    a first printed circuit board including
        a center portion having a first length,
        a first side portion extending outwardly from the center portion in a first direction,
        a second side portion extending outwardly from the center portion in a second direction, the second direction opposite the first direction, and
        a first plurality of light-emitting diodes (LEDs) populated along the first side portion, and a second plurality of LEDs populated along the second side portion, such that the first plurality of LEDs are spaced a first distance apart and the second plurality of LEDs are spaced the first distance apart; and
    a second printed circuit board configured to couple to the first printed circuit board, the second printed circuit board including
        a second center portion having the first length,
        a third side portion extending outwardly from the second center portion in the first direction,
        a fourth side portion extending outwardly from the second center portion in the second direction, and
        a third plurality of light-emitting diodes (LEDs) populated along the third side portion, and a fourth plurality of LEDs populated along the fourth side portion, such that the third plurality of LEDs are spaced the first distance apart and the fourth plurality of LEDs are spaced the first distance apart;
    wherein when the second printed circuit board is coupled to the first printed circuit board the first plurality of LEDs and the fourth plurality of LEDs are spaced a second distance apart, the second distance less than the first distance.

8. The printed circuit board of claim 7, wherein the printed circuit board and the second printed circuit board are coupled together via a connector.

9. The printed circuit board of claim 8, wherein the connector is configured to electrically connect at least one of the first plurality of LEDs of the first printed circuit board to at least one of the second plurality of LEDs of the second printed circuit board.

10. The printed circuit board of claim 7, wherein first printed circuit board has a height within a range of approximately ten inches to approximately eleven inches.

\* \* \* \* \*